United States Patent
Holland (10) Patent No.: US 12,255,263 B2
(45) Date of Patent: Mar. 18, 2025

(54) METHOD FOR PRODUCING A RADIATION EMITTING SEMICONDUCTOR CHIP AND RADIATION EMITTING SEMICONDUCTOR CHIP

(71) Applicant: OSRAM Opto Semiconductors GmbH, Regensburg (DE)

(72) Inventor: Brendan Holland, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 506 days.

(21) Appl. No.: 17/632,523

(22) PCT Filed: Jul. 10, 2020

(86) PCT No.: PCT/EP2020/069501
§ 371 (c)(1),
(2) Date: Feb. 3, 2022

(87) PCT Pub. No.: WO2021/023473
PCT Pub. Date: Feb. 11, 2021

(65) Prior Publication Data
US 2022/0293815 A1    Sep. 15, 2022

(30) Foreign Application Priority Data
Aug. 6, 2019   (DE) .................... 10 2019 121 178.6

(51) Int. Cl.
*H01L 33/00* (2010.01)
*H01L 33/20* (2010.01)
*H01L 33/60* (2010.01)

(52) U.S. Cl.
CPC .......... *H01L 33/0095* (2013.01); *H01L 33/20* (2013.01); *H01L 33/60* (2013.01);
(Continued)

(58) Field of Classification Search
CPC ...................................................... H01L 33/08
See application file for complete search history.

(56) References Cited

U.S. PATENT DOCUMENTS

2015/0129901 A1* 5/2015 Hoppel ............... H01S 5/0239
                                                             438/34
2016/0005941 A1   1/2016 Tsai et al.
(Continued)

FOREIGN PATENT DOCUMENTS

DE     102016105056 A1    9/2017
EP         1256987 A2    11/2002
(Continued)

OTHER PUBLICATIONS

International Search Report issued for the corresponding international patent application No. PCT/EP2020/069501, dated Oct. 16, 2020, 2 pages (for informational purposes only).
(Continued)

*Primary Examiner* — Erik Kielin
(74) *Attorney, Agent, or Firm* — Viering, Jentschura & Partner mbB (57) ABSTRACT

A method for producing a radiation emitting semiconductor chip may include providing a semiconductor layer sequence having an active region configured to generate electromagnetic radiation, applying a reflective layer sequence over the semiconductor layer sequence, generating a first recess through an opening of a mask where the first recess completely penetrates the reflective layer sequence and the active region, and applying a dielectric mirror layer in the first recess through the same opening of the same mask. Furthermore, a radiation emitting semiconductor chip is disclosed.

17 Claims, 3 Drawing Sheets

(52) U.S. Cl.
CPC ............. *H01L 2933/0025* (2013.01); *H01L 2933/0058* (2013.01)

(56) References Cited

U.S. PATENT DOCUMENTS

| | | | |
|---|---|---|---|
| 2017/0331009 A1* | 11/2017 | Shioji | H01L 33/502 |
| 2019/0103520 A1 | 4/2019 | Kopp et al. | |
| 2019/0273187 A1* | 9/2019 | Yoon | H01L 33/46 |
| 2019/0348571 A1* | 11/2019 | Kim | H01L 33/52 |
| 2021/0359188 A1* | 11/2021 | Kim | H01L 33/62 |

FOREIGN PATENT DOCUMENTS

| | | | |
|---|---|---|---|
| EP | 3010050 A1 | 4/2016 | |
| WO | 2008131743 A1 | 11/2008 | |

OTHER PUBLICATIONS

German Search Report issued for the corresponding German patent application No. 10 2019 121 178.6, dated May 25, 2020, 7 pages (for informational purposes only).

\* cited by examiner

METHOD FOR PRODUCING A RADIATION EMITTING SEMICONDUCTOR CHIP AND RADIATION EMITTING SEMICONDUCTOR CHIP

CROSS-REFERENCE TO RELATED APPLICATIONS

The present application is a national stage entry according to 35 U.S.C. § 371 of PCT application No.: PCT/EP2020/069501 filed on Jul. 10, 2020; which claims priority to German Patent Application Serial No.: 10 2019 121 178.6 filed on Aug. 6, 2019; all of which are incorporated herein by reference in their entirety and for all purposes.

TECHNICAL FIELD

A method for producing a radiation emitting semiconductor chip is specified. Furthermore, a radiation emitting semiconductor chip is specified.

BACKGROUND

An object to be solved is to provide a simplified method for producing a radiation emitting semiconductor chip. In addition, a radiation emitting semiconductor chip is to be provided, which is particularly easy to produce.

SUMMARY

According to at least one embodiment of the method, a semiconductor layer sequence is provided comprising an active region configured to generate electromagnetic radiation. In an embodiment, the semiconductor layer sequence is epitaxially grown on a growth substrate. In an embodiment, the semiconductor layer sequence is based on a III-V compound semiconductor material. The III-V compound semiconductor material is, for example, a phosphide, arsenide and/or nitride compound semiconductor material, for example, $In_xAl_yGa_{1-x-y}P$, $In_xAl_yGa_{1-x-y}As$ and/or $In_xAl_yGa_{1-x-y}N$ with $0 \leq x \leq 1$, $0 \leq y \leq 1$ and $x+y \leq 1$.

The semiconductor layer sequence can have dopants as well as additional components. For the sake of simplicity, however, only the essential constituents of the crystal lattice of the semiconductor layer sequence, i.e. Al, Ga, In, N, As or P, are indicated, even if these can be partially replaced and/or supplemented by small amounts of further substances.

The semiconductor layer sequence may have a main extension plane. A vertical direction extends perpendicular to the main extension plane and a lateral direction extends parallel to the main extension plane.

According to at least one embodiment of the method, the semiconductor layer sequence comprises a first semiconductor layer of a first conductivity type and a second semiconductor layer of a second conductivity type different from the first conductivity type. In an embodiment, the first semiconductor layer is n-doped and thus n-conductive. In this case, the second semiconductor layer is formed p-doped and thus p-conductive.

The first semiconductor layer and the second semiconductor layer may be stacked on top of one another in vertical direction.

The active region may be arranged between the first semiconductor layer and the second semiconductor layer. The active region may have a pn-junction for generating the electromagnetic radiation, such as a heterostructure, a single quantum well structure or a multiple quantum well structure.

The electromagnetic radiation generated in the active region during operation can be near-ultraviolet radiation, visible light and/or near-infrared radiation. The visible light is, for example, light of blue, green, yellow or red colour.

According to at least one embodiment of the method, a reflective layer sequence is applied over the semiconductor layer sequence. The semiconductor layer sequence and the reflective layer sequence may be stacked on top of one another in vertical direction. In an embodiment, the reflective layer sequence is a Bragg mirror. The Bragg mirror may include alternately arranged sub-layers of a high refractive index material and a low refractive index material. The sub-layers of the Bragg mirror may include $SiO_2$, $Al_2O_3$, $TiO_2$, $Ta_2O_5$, $Nb_2O_5$, $NbF$, $Si_3N_4$ and/or $Si_2ON_2$.

In an embodiment, the outermost two sub-layers of the reflective layer sequence are formed by $Al_2O_3$. In this case, $SiO_2$ sub-layers and $Nb_2O_5$ sub-layers may be alternately arranged between the outermost two sub-layers. Thicknesses of the alternately arranged sub-layers of the reflective layer sequence may be formed of different sizes.

The reflective layer sequence may have a reflection of at least 98%, in particular of at least 99%, for the electromagnetic radiation generated in the active region.

The reflective layer sequence is applied, for example, by a physical vapour deposition, such as sputtering or vapour deposition, or by a chemical vapour deposition over the semiconductor layer sequence.

According to at least one embodiment of the method, a first recess is generated through an opening of a mask, wherein the first recess completely penetrates the reflective layer sequence and the active region. In an embodiment, the first recess extends from the reflective layer sequence into the semiconductor layer sequence. The second semiconductor layer sequence may not be completely penetrated by the first recess. The first recess may expose the first semiconductor layer in regions. That is, a bottom surface of the first recess is formed by the first semiconductor layer.

Furthermore, a side surface of the first recess may be formed by the first semiconductor layer, the second semiconductor layer and the reflective layer sequence.

The mask may be a photoresist mask. For example, the photoresist mask can be a positive photoresist having the opening. That is, the regions of the layers arranged underneath being not covered by the positive photoresist, in particular the reflective layer sequence arranged underneath, can be removed by means of an etching process, in particular a dry etching process.

According to at least one embodiment of the method, a dielectric mirror layer is applied in the first recess through the same opening of the same mask. The dielectric mirror layer may completely cover the side surfaces of the first recess and the bottom surfaces of the first recess. In an embodiment, the dielectric mirror layer does not completely fill the first recess here. In an embodiment, the dielectric mirror layer is in direct contact with the first semiconductor layer, the second semiconductor layer and the reflective layer sequence in the region of the side surface of the first recess. Furthermore, the dielectric mirror layer may be in direct contact with the first semiconductor layer in the region of the bottom surface of the first recess.

The dielectric mirror layer thereby may have a reflection of at least 98%, in particular of at least 99%, for the electromagnetic radiation generated in the active region.

The dielectric mirror layer may include a dielectric material. In an embodiment, the dielectric mirror layer comprises SiO$_2$ or is formed therefrom. The SiO$_2$ layer may be deposited by plasma enhanced chemical vapour deposition (PECVD).

In an embodiment, the dielectric mirror layer is applied through the same opening in the mask, in particular through the same opening of the photoresist mask, through which the first recess is also generated. That is, the mask, in particular the photoresist mask, is here the same mask, in particular the same photoresist mask, with which the first recess is generated.

In a subsequent step, the mask, in particular the photoresist mask, can be removed. It is possible that during the application of the dielectric mirror layer, material of the dielectric mirror layer is also applied on the mask. In an embodiment, when the mask is removed, the material of the mirror layer applied on the mask is also removed.

In at least one embodiment, the method for producing a radiation emitting semiconductor chip comprises the steps of providing a semiconductor layer sequence comprising an active region configured to generate electromagnetic radiation and applying a reflective layer sequence over the semiconductor layer sequence. The method further comprises the steps of generating a first recess through an opening of a mask, the first recess completely penetrating the reflective layer sequence and the active region, and applying a dielectric mirror layer in the first recess through the same opening of the same mask.

One idea of the method described herein for producing a radiation emitting semiconductor chip is, inter alia, that a generation of the first recess and an application of the dielectric mirror layer on the side surfaces of the first recess can advantageously be realised with a single mask through one opening. Usually, several lithography steps with several photoresist masks are provided for such a process. With the disclosed method, the production steps can thus advantageously be reduced. Thus, a radiation emitting semiconductor chip can be produced in a particularly simple manner.

According to at least one embodiment of the method, the dielectric mirror layer is removed at a bottom surface of the first recess in such a way that the semiconductor layer sequence is exposed there. In this case, the bottom surface of the first recess may be formed by the first semiconductor layer. By removing the dielectric mirror layer, the first semiconductor layer may be exposed. Advantageously, the semiconductor layer sequence, in particular the first semiconductor layer, can be electrically conductively contacted in the exposed region.

According to at least one embodiment of the method, the dielectric mirror layer in the first recess is removed by an anisotropic etching process. The anisotropic etching process may have a higher etching rate in the vertical direction than in the lateral direction. Thus, the dielectric mirror layer in the region of the bottom surface of the first recess may be completely removed, while the dielectric mirror layer remains on the side surface of the first recess. Such an anisotropic etching process may include a dry etching process, such as a reactive ion etching (RIE) process.

According to at least one embodiment of the process, a first contact layer sequence is generated in the first recess through the same opening of the same mask after the removal of the dielectric mirror layer. In an embodiment, the first contact layer sequence does not completely fill the first recess here. In an embodiment, the first contact layer sequence is in direct contact with the dielectric mirror layer in the region of the side surface of the first recess and may cover it completely. Furthermore, the first contact layer sequence may completely cover the exposed semiconductor layer sequence, in particular the exposed first semiconductor layer, in the region of the bottom surface of the first recess.

The first contact layer sequence may include one or more of the following metals: gold, silver, copper, tin, lead, bismuth and/or antimony. Furthermore, the contact layer sequence can comprise a transparent electrically conductive oxide (TCOs), such as zinc oxide. In an embodiment, the contact layer sequence comprises the following layer sequence, starting from the dielectric mirror layer: Ti, Pt, Ag, ZnO. In this case, the ZnO layer forms an exposed outer surface of the first metallic contact layer sequence.

The first contact layer sequence may be reflective for the electromagnetic radiation generated in the active region. The first contact layer sequence may have a reflection of at least 90%, in particular of at least 95%, for the electromagnetic radiation generated in the active region.

According to at least one embodiment of the method, the first contact layer sequence is in direct contact with the exposed semiconductor layer sequence. In an embodiment, the first contact layer sequence is in direct contact with the exposed first semiconductor layer. The layer of the first metallic contact layer sequence directly adjacent to the first semiconductor layer may include titanium or is formed therefrom. Thus, an adhesion between the first metallic contact layer sequence and the semiconductor layer sequence is advantageously particularly good.

According to at least one embodiment of the method, the first contact layer sequence is in direct electrically conductive contact with the first semiconductor layer. A current can be impressed into the semiconductor layer sequence, in particular into the first semiconductor layer, through the first contact layer sequence being in direct contact with the semiconductor layer sequence.

According to at least one embodiment of the method, a transparent electrically conductive layer is arranged between the reflective layer sequence and the semiconductor layer sequence. The transparent electrically conductive layer may be in direct contact with the reflective layer sequence and the semiconductor layer sequence, in particular the first semiconductor layer sequence. Furthermore, the transparent electrically conductive layer may be transparent to the electromagnetic radiation generated during operation.

In an embodiment, the transparent electrically conductive layer has transparent electrically conductive metals or transparent electrically conductive oxides (TCOs). TCOs are transparent conductive materials and comprise, for example, zinc oxide, tin oxide, cadmium oxide, titanium oxide, indium oxide or indium tin oxide (ITO).

According to at least one embodiment of the method, the transparent electrically conductive layer is penetrated at the same time through the same opening of the same mask when the first recess is generated. In this embodiment, the first recess completely penetrates the first reflective layer sequence, the transparent electrically conductive layer, the first semiconductor layer and the active region.

According to at least one embodiment of the method, second recesses are generated in the reflective layer sequence, which completely penetrate the reflective layer sequence. The second recesses may expose the transparent electrically conductive layer in regions. That is, bottom surfaces of the second recesses are formed by the transparent electrically conductive layer. Furthermore, side surfaces of the second recesses may be formed by the reflective layer sequence.

According to at least one embodiment of the method, a second metallic contact layer sequence is applied over the reflective layer sequence and the transparent electrically conductive layer. In this embodiment, the second metallic contact layer sequence is implemented as a layer sequence and may not completely fill the second recesses here. In an embodiment, the second metallic contact layer sequence is in direct contact with the reflective layer sequence in the region of the side surfaces of the second recesses and may cover them completely. Furthermore, the first contact layer sequence completely cover the exposed transparent electrically conductive layer in the region of the bottom surfaces of the second recesses.

Furthermore, it is possible that the second metallic contact layer sequence is not applied in a region, where the first recess is to be generated. The second metallic contact layer sequence may be removed in this region with a wet chemical etching process.

The second metallic contact layer sequence may include a first layer and a second layer. The first layer and the second layer of the second metallic contact layer sequence may be stacked in vertical direction. In this case, the layer directly adjacent to the transparent electrically conductive layer is the first layer of the second metallic contact layer sequence. In an embodiment, the first layer of the second metallic contact layer sequence is formed to be reflective for the electromagnetic radiation generated during operation. In this case, the first layer of the second metallic contact layer sequence comprises silver. The second layer of the second metallic contact layer sequence may be a barrier layer. The barrier layer may include titanium, tungsten or titanium-tungsten. Furthermore, the barrier layer may be formed to prevent diffusion and/or migration of Ag ions in any layers arranged thereabove during the production process.

According to at least one embodiment of the method, the second metallic contact layer sequence is in direct electrically conductive contact with the transparent electrically conductive layer. A current can be impressed into the semiconductor layer sequence, in particular the second semiconductor layer, through the second metallic contact layer sequence being in direct contact with the transparent electrically conductive layer.

According to at least one embodiment of the method, a passivation layer and a further reflective layer sequence are applied over the reflective layer sequence. In an embodiment, the passivation layer and the further reflective layer sequence are applied over the second metallic contact layer sequence. In this case, the passivation layer is in direct contact with the second metallic contact layer sequence.

In an embodiment, the passivation layer comprises a dielectric material. In an embodiment, the passivation layer comprises or is formed from $Al_2O_3$. The passivation layer advantageously protects the second metallic contact layer sequence and/or the reflective layer sequence from external environmental influences.

In an embodiment, the further reflective layer sequence is a Bragg mirror. In an embodiment, the Bragg mirror comprises alternately arranged layers of a high refractive index material and a low refractive index material. The layers of the Bragg mirror may include $SiO_2$, $Al_2O_3$, $TiO_2$, $Ta_2O_5$, $Nb_2O_5$, NbF, $Si_3N_4$ and/or $Si_2ON_2$.

According to at least one embodiment, a metallic intermediate layer is arranged between the second metallic contact layer sequence and the passivation layer. The metallic intermediate layer may completely fill the second recesses. In an embodiment, the intermediate layer in this embodiment is in direct contact with the first and second metallic contact layer sequence and the passivation layer. Advantageously, a current can be spreaded particularly well through the metallic intermediate layer and impressed through the second metallic contact layer sequence into the semiconductor layer sequence, in particular the second semiconductor layer.

Furthermore, it is possible that the metallic intermediate layer is removed or not applied in the region in which the first recess is to be generated.

The metallic intermediate layer may be a planarisation layer which levels an unevenness caused by the second recesses. Thus, the planarisation layer may have a flat top surface. In this case, the intermediate metallic layer, which in this case is formed as a planarisation layer, may have the flat top surface extending in lateral direction and being substantially smooth. "Substantially smooth" means here in particular that the top surface of the planarisation layer has an average roughness of at most 100 nanometres. Advantageously, a further reflective layer sequence can thus be applied on the top surface of the planarisation layer particularly well. If the further reflective layer sequence is a Bragg mirror, the reflectivity of the Bragg mirror is advantageously particularly good due to the planarisation layer.

The metallic intermediate layer may include one or more of the following metals: gold, titanium and/or platinum. In an embodiment, the metallic intermediate layer comprises the following layer sequence, starting from the second metallic contact layer sequence: Ti, Pt, Au, Ti.

The first metallic intermediate layer may be reflective for the electromagnetic radiation generated in the active region. The first metallic intermediate layer exhibit a reflection of at least 90%, in particular of at least 95%, for the electromagnetic radiation generated in the active region.

According to at least one embodiment, the passivation layer and the further reflective layer sequence are penetrated through the same opening of the same mask when the first recess is generated. In this embodiment, the first recess may completely penetrate the passivation layer, the further reflective layer sequence, the first reflective layer sequence, the transparent electrically conductive layer, the first semiconductor layer and the active region. This makes it possible to generate the first recess with a single mask. Advantageously, additional method steps can thus be avoided.

Furthermore, a radiation emitting semiconductor chip is disclosed which can be produced with a method for producing a radiation emitting semiconductor chip described herein. All features and embodiments disclosed in connection with the method for producing the radiation emitting semiconductor chip are therefore also applicable in connection with the radiation emitting semiconductor chip, and vice versa.

According to at least one embodiment, the radiation emitting semiconductor chip comprises a semiconductor layer sequence comprising an active region configured to generate electromagnetic radiation.

According to at least one embodiment, the radiation emitting semiconductor chip comprises a reflective layer sequence arranged over the semiconductor layer sequence.

According to at least one embodiment, a first recess completely penetrates the reflective layer sequence and the active region.

According to at least one embodiment, a dielectric mirror layer is arranged only in the first recess. The dielectric mirror layer may not protrude beyond the first recess in a plan view in lateral direction.

According to at least one embodiment, a diameter of the first recess tapers towards the semiconductor layer sequence. In an embodiment, a distance between two opposing inner surfaces of the first recess decreases towards the semiconductor layer sequence.

In an embodiment, an interface between the reflective layer sequence and the dielectric mirror layer encloses an angle smaller than 90° with a main extension plane of the semiconductor layer sequence. Thus, it is possible that a distance in the lateral direction between two opposing inner surfaces of the dielectric mirror layer also tapers towards the semiconductor layer sequence.

Furthermore, a width of the dielectric mirror layer can taper towards the semiconductor layer sequence. The width of the dielectric mirror layer is defined here in lateral direction.

According to at least one embodiment, the reflective layer sequence and the dielectric mirror layer overlap in plan view. In particular, the reflective layer sequence and the dielectric mirror layer overlap in plan view in the region of the interface between the reflective layer sequence and the dielectric mirror layer. Since the interface between the reflective layer sequence and the dielectric mirror layer encloses an angle smaller than 90° with the main extension plane of the semiconductor layer sequence, the reflective layer sequence and the dielectric mirror layer are arranged one above the other in regions in vertical direction.

Due to the overlap of the reflective layer sequence and the dielectric mirror layer, a reflection coefficient in this region is particularly high. Advantageously, electromagnetic radiation generated during operation can thus be reflected particularly well. This advantageously increases light extraction from the radiation emitting semiconductor chip.

According to at least one embodiment, the dielectric mirror layer covers the side surface of the first recess, while a bottom surface of the first recess is free of the dielectric mirror layer.

According to at least one embodiment, a first contact layer sequence is arranged in the first recess electrically contacting the first semiconductor layer of the semiconductor layer sequence of a first conductivity type.

According to at least one embodiment, a diameter of the first recess is at least 3 micrometers and at most 6 micrometers. In an embodiment, the diameter is at least 4 micrometers and at most 5 micrometers in size. The diameter of the first recess corresponds here to a maximum extension of the first recess in the lateral direction. By a first recess with such a small diameter, little of the active region of the radiation emitting semiconductor chip is removed by the first recess. Thus, the light extraction and efficiency of the semiconductor chip can be formed particularly high.

According to at least one embodiment, the radiation emitting semiconductor chip comprises third recesses, which completely penetrate the reflective layer sequence and the active region. Each third recess may be formed by the first recess. That is, the third recesses can be formed by the method described herein.

According to at least one embodiment, the radiation emitting semiconductor chip comprises second recesses arranged in the reflective layer sequence. In an embodiment, the second recesses completely penetrate the reflective layer sequence. Diameters of the second recesses may each be at least 1 micrometre and at most 5 micrometers in size. In an embodiment, the diameters are each at least 2 micrometers and at most 4 micrometers in size. The diameters of the second recesses correspond here in each case to a maximum extent of a second recess in lateral direction.

According to at least one embodiment, a distance between directly adjacent third recesses is at least 10 micrometers and at most 20 micrometers.

According to at least one embodiment, a distance of directly adjacent second recesses is at least 10 micrometers and at most 20 micrometers.

According to at least one embodiment, the third recesses are arranged at first grid points of a first grid. In this case, the third recesses are arranged in a matrix-like manner, in particular along rows and columns.

According to at least one embodiment, the second recesses are arranged at second grid points of a second grid. In this case, the second recesses are arranged in a matrix-like manner, in particular along rows and columns.

According to at least one embodiment, the first grid is laterally displaced with respect to the second grid. In an embodiment, the first grid points are spaced apart from adjacent second grid points by at least 10 micrometers and at most 20 micrometers. Such an arrangement of the second recesses and the third recesses allows the semiconductor chip to be energised particularly well, in particular particularly homogeneously. In combination with the particularly small third recesses, it is thus possible to improve the efficiency of the semiconductor chip at typical current densities of about 350 mA/mm$^2$ to 1 A/mm$^2$ by about 1% to 2% compared to a conventional semiconductor chip. Further, at current densities of about 5 A/mm$^2$ to 10 A/mm$^2$, the efficiency of the semiconductor chip can be improved by more than 2% compared to a conventional semiconductor chip.

Due to the third recesses, it is advantageously possible to apply a particularly homogeneous current to the first semiconductor layer and to achieve a particularly good current spreading. Advantageously, the doping level of the first semiconductor layer can be reduced, for example, without reducing the current spreading properties in the region of the first semiconductor layer.

BRIEF DESCRIPTION OF THE DRAWINGS

In the following, the method for producing a radiation emitting semiconductor chip and the radiation emitting semiconductor chip will be explained in more detail with reference to the Figures by means of exemplary embodiments.

Elements that are identical, similar or have the same effect are given the same reference signs in the Figures. The Figures and the proportions of the elements shown in the Figures are not to be regarded as true to scale. Rather, individual elements can be shown exaggeratedly large for better representability and/or for better comprehensibility.

DETAILED DESCRIPTION

Figure 1:
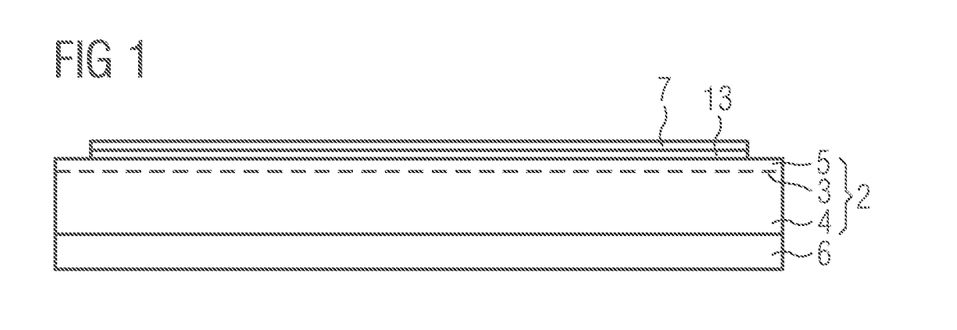
FIGS. 1, 2, 3, 4, 5 and 6 schematic sectional views of method stages of a method for producing a radiation emitting semiconductor chip according to an exemplary embodiment, and FIG. 7 a schematic representation in plan view of a radiation emitting semiconductor chip according to an exemplary embodiment.

In the method according to the exemplary embodiment of FIGS. 1, 2, 3, 4, 5 and 6, a semiconductor layer sequence 2 is provided, over which a transparent electrically conductive layer 13 is applied, as shown in FIG. 1. The semiconductor layer sequence 2 comprises a first semiconductor layer 4 of a first conductivity type and a second semiconductor layer 5 of a second conductivity type different from the first conductivity type.

In this exemplary embodiment, the first semiconductor layer 4 is formed n-doped and thus n-conductive. In this case, the second semiconductor layer 5 is formed p-doped and thus p-conductive. An active region 3, which is configured to generate electromagnetic radiation, is arranged between the first semiconductor layer 4 and the second semiconductor layer 5.

Furthermore, a sub-layer of a reflective layer sequence 7 is applied over the transparent electrically conductive layer 13. In this exemplary embodiment, the transparent electrically conductive layer 13 is formed by ITO and may have a thickness of about 15 nanometres. The sub-layers of the reflective layer sequence 7 is formed here by $Al_2O_3$ and may have a thickness of about 30 nanometres.

Furthermore, the semiconductor layer sequence 2 is epitaxially grown on a growth substrate 6. In this case, the growth substrate 6 is formed by sapphire and has a thickness of approximately 1000 micrometers. Furthermore, the semiconductor layer sequence 2 is formed to be approximately 5.8 micrometers thick. In this exemplary embodiment, the semiconductor layer sequence 2 comprises a nitride compound semiconductor material.

Figure 2:
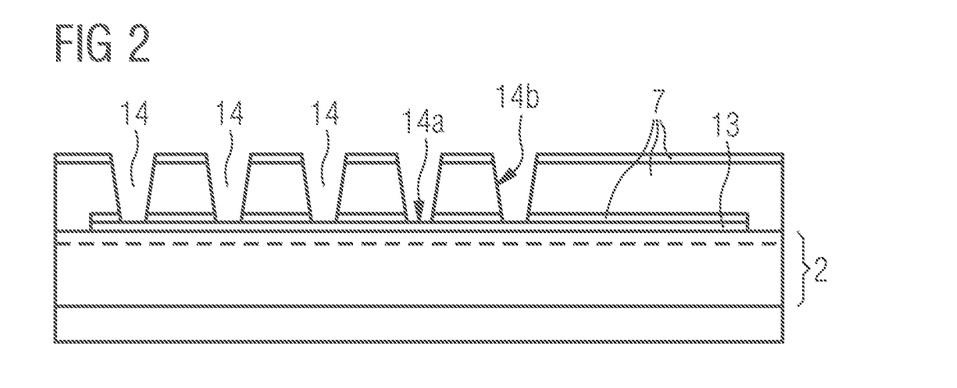

In a further method step, the reflective layer sequence 7 is applied over the semiconductor layer sequence 2 (FIG. 2). In this exemplary embodiment, the reflective layer sequence 7 is a Bragg mirror. The Bragg mirror here comprises alternately arranged sub-layers of a high refractive index material and a low refractive index material. Between the outermost two sub-layers, which are each formed of $Al_2O_3$, $SiO_2$ sub-layers and $Nb_2O_5$ sub-layers are alternately arranged. In this exemplary embodiment, a layer sequence as viewed from the transparent electrically conductive layer 13 is as follows: $Al_2O_3$, $SiO_2$ with a thickness of in about 350 nanometres, $Nb_2O_5$, $SiO_2$ with a thickness of in about 89 nanometres, $Nb_2O_5$, $SiO_2$ with a thickness of in about 30 nanometres, $Al_2O_3$. The $Al_2O_3$ sub-layers each have a thickness of about 30 nanometres. The $Nb_2O_5$ sub-layers each have a thickness of about 48 nanometres.

The $Al_2O_3$ sub-layers are each applied by atomic layer deposition (ALD). The remaining sub-layers are applied by sputtering.

Furthermore, second recesses 14 are generated in the reflective layer sequence 7, which completely penetrate the reflective layer sequence 7. The second recesses 14 expose the transparent electrically conductive layer 13 in the region of the second recesses 14. The bottom surfaces of the second recesses 14a are formed by the transparent electrically conductive layer 13 and the side surfaces of the second recesses 14b are formed by the reflective layer sequence 7.

The $Al_2O_3$ sub-layers and the remaining sub-layers are each removed by a separate process. For example, the $Al_2O_3$ sub-layers are removed using a wet chemical etching process and the remaining sub-layers are removed using a dry chemical etching process.

Figure 3:
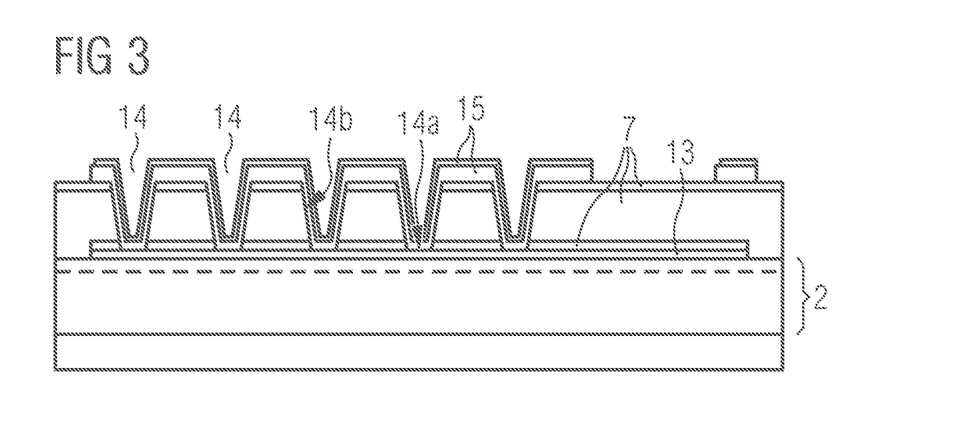

Subsequently, a second metallic contact layer sequence 15 is applied over the reflective layer sequence 7 and the transparent electrically conductive layer 13, in particular in the second recesses (see FIG. 3). In this exemplary embodiment, the second metallic contact layer sequence 15 is not arranged in a region in which a first recess 8 is to be generated. The second metallic contact layer sequence 15 covers the reflective layer sequence 7 only to a large extent. In this case, a large extent means in particular that the second metallic contact layer sequence 15 covers at least 90%, in particular at least 95%, of an outer surface of the reflective layer sequence 7 facing away from the semiconductor layer sequence 2.

The second metallic contact layer sequence 15 comprises here a first layer and a second layer. In this exemplary embodiment, the first layer of the second metallic contact layer sequence 15 directly adjacent to the transparent electrically conductive layer comprises silver and has a thickness of approximately 200 nanometres. The second layer of the second metallic contact layer sequence 15 arranged thereabove may include titanium tungsten and forms a barrier layer. The barrier layer here has a thickness of approximately 20 nanometres. The two layers of the second metallic contact layer sequence 15 thus do not completely fill the second recesses 14.

Figure 4:
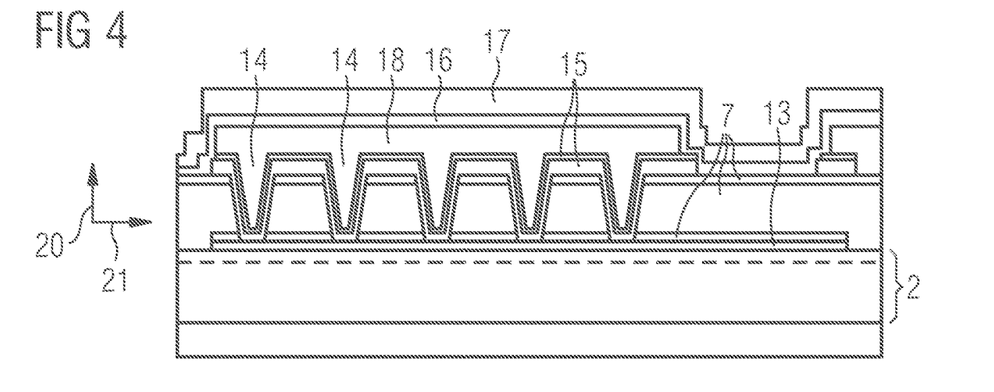

In a subsequent method step, a metallic intermediate layer 18 is arranged on the second metallic contact layer sequence 15 (FIG. 4). The metallic intermediate layer 18 completely fills the second recesses 14 and protrudes beyond the second recesses 14 in vertical direction 20 and lateral direction 21. In this exemplary embodiment, the metallic intermediate layer 18 is not arranged in a region in which a first recess 8 is to be generated. Here, the metallic intermediate layer 18 has the following layer sequence, starting from the second metallic contact layer sequence 15: Ti with a thickness of in about 1 nanometre, Pt with a thickness of in about 40 nanometres, Au with a thickness of in about 550 nanometres, Ti with a thickness of in about 10 nanometres.

Furthermore, a passivation layer 16 and a further reflective layer sequence 17 are applied over the reflective layer sequence 7, in particular on the metallic intermediate layer 18. The passivation layer 16 is formed here by $Al_2O_3$ with a thickness of approximately 30 nanometres. The passivation layer 16 can be applied by an ALD process.

Furthermore, the further reflective layer sequence 17 is a Bragg mirror. This Bragg mirror may include alternately arranged $SiO_2$ and $Si_2ON_2$ layers. Furthermore, a coating for protection against external environmental influences can be applied over this Bragg mirror by means of a PECVD process.

Figure 5:
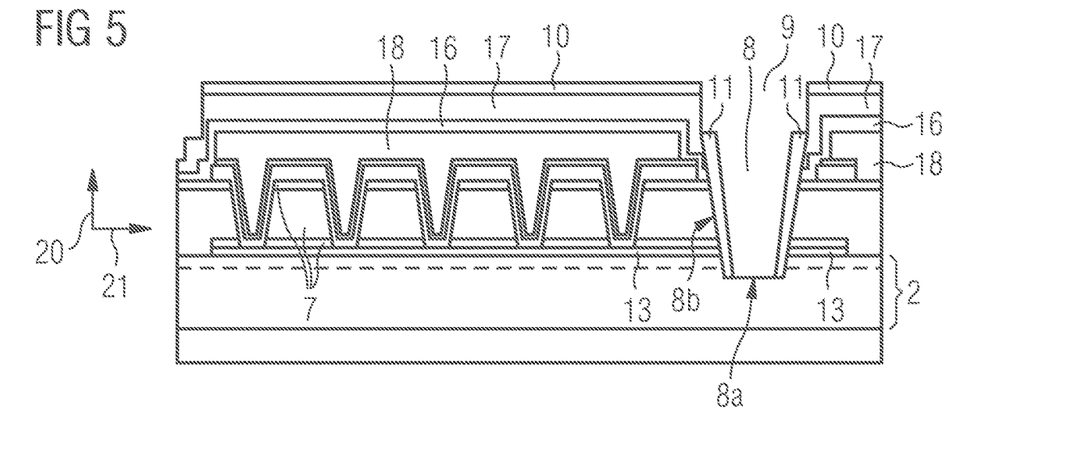

In a next method step, a first recess 8 is generated through an opening 9 of a mask 10 (FIG. 5). In this exemplary embodiment, the first recess 8 completely penetrates the further reflective layer sequence 17, the passivation layer 16, the reflective layer sequence 7, the transparent electrically conductive layer 13, the second semiconductor layer 5 and the active region 3. The first recess 8 extends into the first semiconductor layer 4. The first recess 8 exposes the first semiconductor layer 4 such that a bottom surface of the first recess 8a is formed by the first semiconductor layer 4. A side surface of the first recess 8b is formed here by the further reflective layer sequence 17, the passivation layer 16, the reflective layer sequence 7, the transparent electrically conductive layer 13, the second semiconductor layer 5 and the active region 3. A diameter of the first recess 8 in this exemplary embodiment is at least 3 micrometers and at most 6 micrometers.

The side surface of the first recess 8b thus generated encloses an angle smaller than 90° with the main extension plane of the semiconductor layer sequence 2. In this exemplary embodiment, a distance in lateral direction 21 between two opposing inner surfaces of the dielectric mirror layer 8 tapers towards the semiconductor layer sequence 2.

In this exemplary embodiment, the mask 10 is a photoresist mask formed as a positive photoresist. Furthermore, the photoresist mask comprises the opening 9. The regions not covered by the positive photoresist are removed here by means of an etching process, in particular a dry etching process, for example by inductively coupled plasma—reactive ion etching (ICP-RIE). The bottom surface of the first recess 8*a* and the side surface of the first recess 8*b* can be cleaned after the etching process by means of potassium hydroxide at a temperature of 40° C.

Subsequently, a dielectric mirror layer 11 is applied in the first recess 8 through the same opening 9 of the same mask 10. The dielectric mirror layer 8 completely covers the side surfaces of the first recess 8*b* and the bottom surfaces of the first recess 8*a*. Here, the first recess 8 is not completely filled by the dielectric mirror layer 11. In this exemplary embodiment, the dielectric mirror layer 11 is formed by $SiO_2$. The $SiO_2$ layer is applied here by a PECVD process. In "PECVD", the dielectric mirror layer is formed using tetraethyl orthosilicate (TEOS). The TEOS is the source of the silicon here.

The dielectric mirror layer 11 thus generated is removed from the bottom surface of the first recess 8*a* such that the first semiconductor layer 4 is exposed there. The removal of the dielectric mirror layer 11 is realised by an anisotropic etching process. The anisotropic etching process has a higher etching rate in vertical direction 20 than in lateral direction 21. Thus, the dielectric mirror layer 11 is completely removed in the region of the bottom surface of the first recess 8*a*, while the dielectric mirror layer 11 remains on the side surface of the first recess 8*b*. After the etching process, the dielectric mirror layer 11 has a thickness in lateral direction 21 of approximately 500 nanometres.

Such a dielectric mirror layer 11 is arranged only in the first recess 8 and does not protrude beyond the first recess 8 in lateral direction 21 in plan view. In this exemplary embodiment, the reflective layer sequence 7 and the dielectric mirror layer 11 partially overlap in top view in lateral direction 21. The reflective layer sequence 7 and the dielectric mirror layer 11 overlap here in plan view in the region of an interface between the reflective layer sequence 7 and the dielectric mirror layer 11.

Furthermore, the dielectric mirror layer 11 protruding beyond the reflective layer sequence 7 in vertical direction 20. A protruding region of the dielectric mirror layer 11 facing away from the semiconductor layer sequence 2 also overlaps with the reflective layer sequence 7 in plan view.

Figure 6:
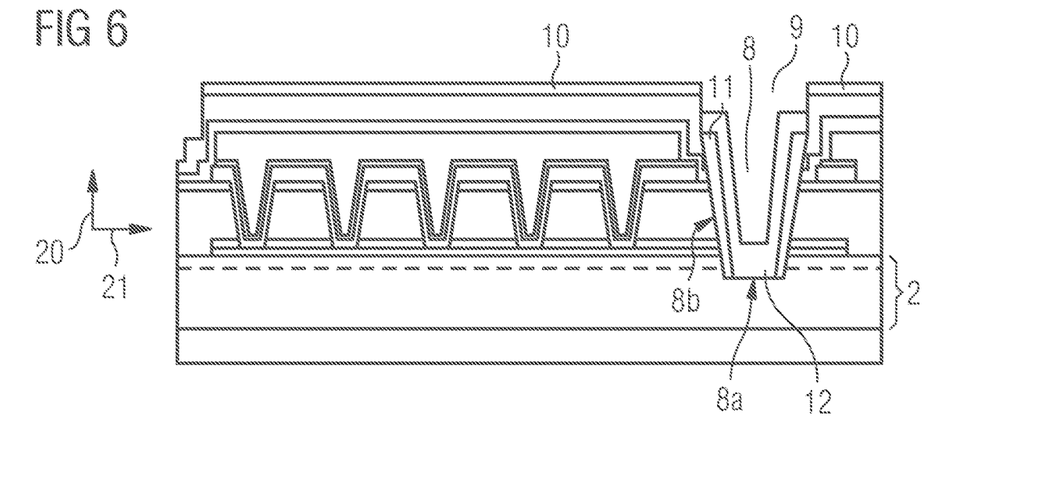

Subsequently, a first contact layer sequence 12 is generated in the first recess 8 through the same opening 9 of the same mask 10 after removing the dielectric mirror layer 11 (FIG. 6). The first contact layer sequence 12 does not completely fill the first recess 8 here. The first contact layer sequence 12 completely covers the dielectric mirror layer 11. Furthermore, the first contact layer sequence 12 completely covers the exposed semiconductor layer sequence 2, in particular the exposed first semiconductor layer 4.

The first contact layer sequence 12 is in direct contact with the exposed first semiconductor layer 4. Furthermore, the first contact layer sequence 12 is in direct electrically conductive contact with the first semiconductor layer 4. Thus, a current can be impressed into the first semiconductor layer 4 through the first contact layer sequence 12.

In this exemplary embodiment, the first contact layer sequence 12 is formed by the following layer sequence, starting from the dielectric mirror layer: Ti, Pt, Ag, ZnO. In this case, the ZnO layer forms an exposed outer surface of the first metallic contact layer sequence. This exposed outer surface of the first metallic contact layer sequence can be contacted from the outside.

Figure 7:
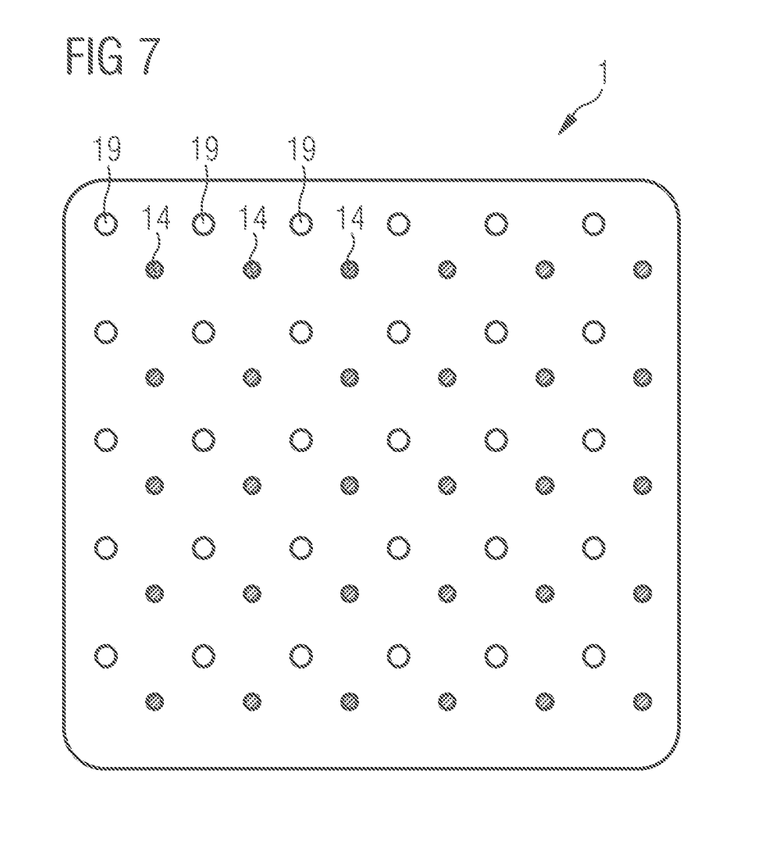

The radiation emitting semiconductor chip 1 according to the exemplary embodiment of FIG. 7 comprises third recesses 19 which completely penetrate a reflective layer sequence 7 and an active region 3. Each third recess 19 in this exemplary embodiment is formed by a first recess 8.

Furthermore, a dielectric mirror layer 11 and a first contact layer sequence 12 are arranged in each of the third recesses 19.

In this exemplary embodiment, the third recesses 19 are arranged at first grid points of a first grid. Here, the first grid is a regular quadrilateral grid. Furthermore, second recesses 14 are arranged at second grid points of a second grid. The second grid is also a regular quadrilateral grid. Alternatively, the first grid and the second grid can have other grid shapes, such as a triangular grid or a hexagonal grid.

In this exemplary embodiment, the first grid is laterally displaced with respect to the second grid. Here, the third recesses 19 are spaced apart from directly adjacent second recesses 14 by at least 10 micrometers and at most 20 micrometers. Furthermore, directly adjacent third recesses 19 have a distance of at least 10 micrometers and at most 20 micrometers. Directly adjacent second recesses 14 also have a distance of at least 10 micrometers and at most 20 micrometers.

The third recesses 19 here have a diameter of approximately 5 micrometers. A diameter of the second recesses 14 is formed smaller than the diameter of the third recesses 19. The diameter of the second recesses 14 is approximately 3 micrometers.

This patent application claims the priority of German patent application 102019121178.6, the disclosure of which is hereby incorporated by reference.

The features and exemplary embodiments described in connection with the Figures can be combined with one another according to further exemplary embodiments, although not all combinations are explicitly described. Furthermore, the exemplary embodiments described in connection with the Figures can alternatively or additionally have further features according to the description in the general part.

The invention is not limited by the description on the basis of the exemplary embodiments. Rather, the invention encompasses any new feature as well as any combination of features, which in particular includes any combination of features in the claims, even if this feature or combination itself is not explicitly indicated in the claims or exemplary embodiments.

REFERENCES 1 radiation emitting semiconductor chip
2 semiconductor layer sequence
3 active region
4 first semiconductor layer
5 second semiconductor layer
6 growth substrate
7 reflective layer sequence
8 first recess
8*a* bottom surface of first recess
8*b* side surface of first recess
9 opening
10 mask
11 dielectric mirror layer
12 first contact layer sequence
13 transparent electrically conductive layer
14 second recess
14*a* bottom surface of second recess
14*b* side surface of second recess
15 second metallic contact layer sequence
16 passivation layer
17 further reflective layer sequence
18 intermediate metallic layer 19 third recesses
20 vertical direction
21 lateral direction

The invention claimed is:

1. A method for producing a radiation emitting semiconductor chip, wherein the method comprises:
providing a semiconductor layer sequence comprising an active region configured to generate electromagnetic radiation;
applying a reflective layer sequence over the semiconductor layer sequence;
generating a first recess through an opening of a mask; wherein the first recess completely penetrates the reflective layer sequence and the active region;
applying a dielectric mirror layer in the first recess through the same opening of the same mask; and
generating a first contact layer sequence in the first recess through the same opening of the same mask after a removal of the dielectric mirror layer in places.

2. The method according to claim 1, wherein the dielectric mirror layer is removed at a bottom surface of the first recess in such a way that the semiconductor layer sequence is exposed there.

3. The method according to claim 2, wherein the removal of the dielectric mirror layer occurs by an anisotropic etching process.

4. The method according to claim 2, wherein the first contact layer sequence is in direct contact with the exposed semiconductor layer sequence.

5. The method according to claim 4, wherein:
the semiconductor layer sequence comprises a first semiconductor layer of a first conductivity type and a second semiconductor layer of a second conductivity type different from the first conductivity type;
the first contact layer sequence is in direct electrically conductive contact with the first semiconductor layer.

6. The method according to claim 1, further comprising a transparent electrically conductive layer arranged between the reflective layer sequence and the semiconductor layer sequence.

7. The method according to claim 6, wherein the transparent electrically conductive layer is penetrated at the same time through the same opening of the same mask when the first recess is generated.

8. The method according to claim 1, further comprising generating second recesses in the reflective layer sequence, which completely penetrate the reflective layer sequence.

9. The method according to claim 8,
further comprising applying a second metallic contact layer sequence over the reflective layer sequence and the transparent electrically conductive layer; and
wherein the second metallic contact layer sequence is in direct electrically conductive contact with the transparent electrically conductive layer.

10. The method according to claim 1, further comprising applying a passivation layer and a further reflective layer sequence over the reflective layer sequence.

11. The method according to claim 10, wherein the passivation layer and the further reflective layer sequence are penetrated through the same opening of the same mask when generating the first recess.

12. The method according to claim 10, wherein a metallic intermediate layer is arranged between the second metallic contact layer sequence and the passivation layer.

13. A radiation emitting semiconductor chip comprising:
a semiconductor layer sequence comprising an active region configured to generate electromagnetic radiation; and
a reflective layer sequence arranged over the semiconductor layer sequence;
wherein:
a first recess completely penetrates the reflective layer sequence and the active region;
a diameter of the first recess tapers towards the semiconductor layer sequence;
a dielectric mirror layer is arranged only in the first recess;
second recesses are arranged in the reflective layer sequence and the second recesses completely penetrate the reflective layer sequence;
third recesses which completely penetrate the reflective layer sequence and the active region; and
the reflective layer sequence and the dielectric mirror layer overlap in plan view.

14. The radiation emitting semiconductor chip according to claim 13,
wherein:
the dielectric mirror layer covers the side surface of the first recess, while a bottom surface of the first recess is free of the dielectric mirror layer; and
a first contact layer sequence is arranged in the first recess electrically contacting a first semiconductor layer of the semiconductor layer sequence of a first conductivity type.

15. The radiation emitting semiconductor chip according to claim 13, wherein the diameter of the first recess ranges from at least 3 micrometers to at most 6 micrometers.

16. The radiation emitting semiconductor chip according to claim 13,
wherein:
a distance between directly adjacent third recesses ranges from at least 10 micrometers to at most 20 micrometers; and
a distance between directly adjacent second recesses ranges from at least 10 micrometers to at most 20 micrometers.

17. The radiation emitting semiconductor chip according to claim 13,
wherein:
the third recesses are arranged at first grid points of a first grid;
the second recesses are arranged at second grid points of a second grid; and
the first grid is laterally displaced relative to the second grid.

* * * * *